(12) United States Patent
Tsang et al.

(10) Patent No.: US 10,348,403 B2
(45) Date of Patent: Jul. 9, 2019

(54) LIGHT EMITTING DEVICE FOR GENERATING LIGHT WITH EMBEDDED INFORMATION

(71) Applicant: SIGNIFY HOLDING B.V., Eindhoven (NL)

(72) Inventors: Peter Tjin Sjoe Kong Tsang, Eindhoven (NL); Ruben Rajagopalan, Neuss (DE); Harry Broers, 'S-Hertogenbosch (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/747,163

(22) PCT Filed: Jul. 5, 2016

(86) PCT No.: PCT/EP2016/065835
§ 371 (c)(1),
(2) Date: Jan. 24, 2018

(87) PCT Pub. No.: WO2017/016822
PCT Pub. Date: Feb. 2, 2017

(65) Prior Publication Data
US 2018/0219624 A1  Aug. 2, 2018

(30) Foreign Application Priority Data
Jul. 27, 2015 (EP) ................................ 15178473

(51) Int. Cl.
*H04B 10/116* (2013.01)
*H04B 10/114* (2013.01)
(Continued)

(52) U.S. Cl.
CPC ............ *H04B 10/116* (2013.01); *H01L 33/54* (2013.01); *H04B 10/1141* (2013.01);
(Continued)

(58) Field of Classification Search
None
See application file for complete search history.

(56) References Cited

U.S. PATENT DOCUMENTS 5,608,381 A * 3/1997 McCarney ........... A01K 15/023
119/719
5,797,125 A * 8/1998 Hirohama ........ G06K 19/07758
340/4.41
(Continued)

FOREIGN PATENT DOCUMENTS

| KR | 20140033540 A | 3/2014 |
|---|---|---|
| WO | 2013068861 A1 | 5/2013 |
| WO | 2015049614 A1 | 4/2015 |

OTHER PUBLICATIONS

Hani Al Hajjar et al., "Fiber-Distributed Indoor High Bitrate Optical Wireless System," Wireless Personal Multimedia Communications (WPMC), 2011 14th International Symposium on, IEEE Oct. 2011 (5 pages).

(Continued)

*Primary Examiner* — Curtis J King
(74) *Attorney, Agent, or Firm* — Akarsh P. Belagodu

(57) ABSTRACT

A light emitting device (100) for emitting a beam of light is disclosed. The light emission of the light emitting device (100) comprises an embedded code. The light emitting device (100) comprises a beam shape controller (102) for controlling a shape of the beam of light and a first processor connected to the beam shape controller, arranged for generating the embedded code. The first processor (104) is further arranged for embedding a message in the embedded code based on the shape of the beam of light. This allows the light emitting device (100) to communicate information to a receiving device based on its effect area (i.e. the illuminated area). This information may, for example, comprise information about the beam shape and size, which may be used (Continued)

to determine an area wherein the receiving device is located relative to the light emitting device (100).

14 Claims, 5 Drawing Sheets

(51) Int. Cl.
  *H01L 33/54* (2010.01)
  *H05B 33/08* (2006.01)
  *H05B 37/02* (2006.01)
(52) U.S. Cl.
  CPC ..... *H04B 10/1149* (2013.01); *H05B 33/0896* (2013.01); *H05B 37/0272* (2013.01)

(56) References Cited

U.S. PATENT DOCUMENTS

| | | | | |
|---|---|---|---|---|
| 6,195,555 B1* | 2/2001 | Dent | ........... | H04B 7/18545 342/350 |
| 6,542,716 B1* | 4/2003 | Dent | ........... | H04B 7/1855 342/354 |
| 7,123,159 B2 | 10/2006 | Giannopoulos et al. | | |
| 7,952,292 B2* | 5/2011 | Vegter | ........... | H05B 37/02 315/149 |
| 8,866,391 B2* | 10/2014 | Ganick | ........... | G01C 21/206 315/120 |
| 9,893,768 B2* | 2/2018 | Leabman | ........... | H04B 5/0037 |
| 10,075,239 B2* | 9/2018 | Kato | ........... | H04B 10/116 |
| 2002/0060659 A1* | 5/2002 | Matsuda | ........... | G02B 5/1828 345/94 |
| 2004/0183775 A1* | 9/2004 | Bell | ........... | G06F 3/011 345/156 |
| 2006/0159281 A1* | 7/2006 | Koh | ........... | H04R 3/005 381/92 |
| 2007/0099623 A1* | 5/2007 | Stephensen | ........... | H04W 4/02 455/446 |
| 2007/0147843 A1* | 6/2007 | Fujiwara | ........... | H04B 10/1143 398/118 |
| 2008/0044188 A1* | 2/2008 | Kagawa | ........... | H04B 10/1141 398/128 |
| 2008/0055041 A1* | 3/2008 | Takene | ........... | G07C 9/00111 340/5.7 |
| 2008/0170863 A1* | 7/2008 | Won | ........... | H04B 10/1141 398/172 |
| 2008/0259731 A1* | 10/2008 | Happonen | ........... | G10K 11/34 367/121 |
| 2009/0022112 A1* | 1/2009 | Shin | ........... | H04B 10/1149 370/336 |
| 2009/0045773 A1* | 2/2009 | Pandya | ........... | B60L 5/005 320/108 |
| 2009/0073952 A1* | 3/2009 | Shin | ........... | H04B 10/1149 370/345 |
| 2009/0157309 A1* | 6/2009 | Won | ........... | G01C 21/20 701/533 |
| 2009/0180780 A1* | 7/2009 | Ann | ........... | H04B 10/1149 398/128 |
| 2009/0245806 A1* | 10/2009 | Murayama | ........... | H04B 10/1141 398/130 |
| 2010/0034540 A1* | 2/2010 | Togashi | ........... | H04B 10/116 398/118 |
| 2010/0096993 A1* | 4/2010 | Ashdown | ........... | F21V 29/004 315/113 |
| 2011/0217044 A1* | 9/2011 | Kang | ........... | H04B 10/1149 398/67 |
| 2012/0025964 A1* | 2/2012 | Beggs | ........... | B60Q 1/2673 340/435 |
| 2012/0310703 A1* | 12/2012 | Cavalcanti | ........... | G06Q 30/0201 705/7.29 |
| 2013/0343768 A1* | 12/2013 | Jang | ........... | H04B 10/516 398/183 |
| 2014/0153923 A1* | 6/2014 | Casaccia | ........... | H04B 10/1149 398/58 |
| 2014/0186049 A1* | 7/2014 | Oshima | ........... | H04B 10/1143 398/118 |
| 2014/0250498 A1* | 9/2014 | Yamasaki | ........... | H04L 9/00 726/4 |
| 2014/0255038 A1* | 9/2014 | Richards, IV | ........ | H04B 10/116 398/118 |
| 2014/0265878 A1* | 9/2014 | Gritti | ........... | H04B 10/116 315/153 |
| 2014/0301737 A1* | 10/2014 | Guo | ........... | H04B 10/116 398/118 |
| 2015/0373610 A1* | 12/2015 | Zhi | ........... | H04B 10/116 398/25 |
| 2016/0072582 A1* | 3/2016 | Kido | ........... | H04B 10/116 398/115 |
| 2016/0087486 A1* | 3/2016 | Pogorelik | ........... | H02J 7/025 320/108 |
| 2016/0197675 A1* | 7/2016 | Ganick | ........... | H04N 5/2256 398/172 |
| 2016/0211116 A1* | 7/2016 | Lock | ........... | H01J 37/305 |
| 2016/0259540 A1* | 9/2016 | Hole | ........... | G06F 3/04847 |
| 2016/0281963 A1* | 9/2016 | Dussaume | ........ | H04B 10/1141 |
| 2017/0103659 A1* | 4/2017 | Jin | ........... | G08G 5/006 |
| 2017/0207851 A1* | 7/2017 | Zeng | ........... | H04L 12/46 |
| 2018/0123906 A1* | 5/2018 | Liao | ........... | G06F 3/04845 |
| 2018/0138958 A1* | 5/2018 | Asplund | ........... | H04B 17/11 |
| 2018/0139342 A1* | 5/2018 | Yamaguchi | ........ | H04N 1/00973 |
| 2018/0212678 A1* | 7/2018 | Gummadi | ........... | H04B 10/116 |

OTHER PUBLICATIONS

Ton Koonen, "Optical Techniques for GBIT/S Wireless Indoor Access," 2014 International Topical Meeting on Microwave Photonics (MWP) and the 2014 9th Asia-Pacific Microwave Photonics Conference (APMP), 2014 (6 Pages).

\* cited by examiner 302
 304
 306
 308
 310, 310'
 312
 312'

LIGHT EMITTING DEVICE FOR GENERATING LIGHT WITH EMBEDDED INFORMATION

CROSS-REFERENCE TO PRIOR APPLICATIONS

This application is the U.S. National Phase application under 35 U.S.C. § 371 of International Application No. PCT/EP2016/065835, filed on Jul. 5, 2016, which claims the benefit of European Patent Application No. 15178473.3, filed on Jul. 27, 2015. These applications are hereby incorporated by reference herein.

FIELD OF THE INVENTION

The invention relates to a light emitting device for generating an embedded code comprised in the light emission of the light emitting device. The invention further relates to a system for generating and detecting an embedded code comprised in the light emission of a light emitting device. The invention further relates to a method of generating an embedded code comprised in the light emission of a light emitting device.

BACKGROUND

Home, public and professional environments may contain a large number of lighting devices comprising light sources, such as light-emitting diodes (LEDs), with the capability of transmitting information by means of coding its light output. One application of such a lighting device is to provide control functionality by communicating information comprising control commands to further devices. Another application, as disclosed in U.S. Pat. No. 7,123,159B2, is to provide position information via coded light to handheld or wearable devices, such as mobile phones, allowing the handheld devices to determine their position relative to one or more lighting devices emitting the coded light. In these applications, the accuracy of information communication between the lighting device and the receiving device is dependent on the characteristics of the lighting device (the lighting device may, for example, have a very broad field of illumination). This may result in, for example, that a receiving device may be able to receive messages that are not intended for the receiving device. Inaccurate information communication may further lead to either positioning problems or control problems. Thus, there is a need in the art for improved communication accuracy between the coded light emitting device and the receiving device.

SUMMARY OF THE INVENTION

The inventors have realized that many factors are not constant for a light emitting device with an controllable beam shape. For example: the coverage area changes depending on the beam shape/size (resulting in that more or less receiving devices can receive the light), the position accuracy changes when the beam shape changes (which may be relevant in embodiments wherein receiving devices determine their position based on the light), the light intensity changes depending on the beam size, etc. Thus, there is a need to enable receiving devices to receive correct information from a light emitting device with a controllable beam shape.

It is an object of the present invention to provide improved communication accuracy between a device emitting a coded beam of light and a receiving device. It is a further object of the present invention to provide new communication paradigms between the device emitting the coded beam of light and the receiving device.

According to a first aspect of the present invention the object is achieved by a light emitting device for emitting a beam of light, the light emission comprising an embedded code, the light emitting device comprising:

a beam shape controller for controlling a shape of the beam of light, and a first processor connected to the beam shape controller, arranged for generating the embedded code, wherein the first processor is further arranged for embedding a message in the embedded code based on the shape of the beam of light.

The light emitting device is able to determine which message to embedded in its light emission based on its beam shape, allowing the light emitting device to communicate information to a receiving device based on its effect area (i.e. the illuminated area). The light emitting device has an controllable effect area, which is beneficial because it allows the light emitting device (or for example a user operating the light emitting device) to determine in which area receiving devices may receive its information. It also allows the light emitting device to communicate information about its effect area to receiving devices. This information may, for example, comprise information about the beam shape and size, thereby providing the receiving device information which may be used to determine an area wherein the receiving device is located relative to the light emitting device.

In an embodiment of the light emitting device, the embedded code is comprised in visible light in the light beam emitted by the light emitting device. This embodiment is beneficial if the light emitting device has illumination functionality, because it removes the requirement for a dedicated code emitting source in the light emitting device. Comprising the embedded code in visible light results in that the embedded code may only be detected by a receiving device that is located in the illuminated area, which is advantageous because it makes the effect area (i.e. the illuminated area) of the light emitting device perceptible to a user.

In an embodiment of the light emitting device, the beam shape controller comprises controllable optics for controlling the shape of the beam. The controllable optics (such as moveable lenses, mirrors, reflectors, shades or other light distribution elements) determine the beam shape. This embodiment is advantageous, because it allows control of the beam shape of the light emission of the light emitting device, even if the light emitting device comprises only one light source.

In an alternative embodiment, the light emitting device comprises a plurality of light sources arranged for emitting the light, and the beam shape controller is arranged for controlling the shape of the beam by selectively controlling the light emission of the plurality of light sources. This embodiment allows for non-mechanical (digital) control of the beam source, which is advantageous because it may remove the need for controllable optics. This embodiment may further result in a more robust and more accurately controllable beam shape.

In an embodiment of the light emitting device, the first processor is further arranged for controlling the beam shape controller. This embodiment allows the light emitting device to control the beam shape of the light emission, and therewith the effect area wherein receiving devices receive the information comprised in the embedded code emitted by the light emitting device.

In an embodiment of the light emitting device, the light emitting device further comprises a user interaction element coupled to the beam shape controller, wherein the user interaction element is arranged for receiving a user input, and wherein the control of the shape of the beam is based on the user input. This embodiment allows a user operating the light emitting device to control the beam shape of the light emission, and therewith the effect area wherein receiving devices receive the message comprised in the embedded code emitted by the light emitting device.

In an embodiment of the light emitting device, the first processor is arranged for embedding a multicast message in the embedded code for a first shape of the beam and for embedding a unicast message in the embedded code for a second shape of the beam, wherein the first shape is different from the second shape, and wherein the multicast message is intended to be received by a plurality of receiving devices and the unicast message is intended to be received by a predetermined receiving device. This allows the processor to generate a unicast message, which is intended for a single receiving device, for a narrow beam shape, and to generate a multicast message, which is intended for a plurality of receiving devices, for a broad beam shape.

The first processor is further arranged for embedding beam shape information in the message. This embodiment allows the light emitting device to communicate information about the beam shape to a receiving device, thereby communicating the effect area to a receiving device.

In an embodiment of the light emitting device, the first processor is further arranged for embedding position information in the message, the position information being related to the position of the light emitting device. A receiving device may decode the embedded code to retrieve the message, and therewith the position information, allowing the receiving device to determine its position. In the embodiment wherein beam shape information is further embedded in the message, the receiving device may determine in which area relative to the light emitting device it is located.

In an embodiment of the light emitting device, the first processor is further arranged for controlling an intensity of the light emission of the light emitting device based on the shape of the beam. This embodiment allows the light emitting device to increase or decrease the intensity of the light output based on the size/shape of the beam, which may result in an improved signal/noise ratio (the signal being the light emission comprising the embedded code emitted by the light emitting device, and the noise being light from further light emitting sources). The adjustment of the intensity of the light emission may be further beneficial in the embodiment wherein the embedded code is comprised in the visible light emitted by the light emitting device, because it may allow a user to see the effect area more clearly.

In an embodiment of the light emitting device, the first processor is further arranged for controlling a colour of the light emission of the light emitting device based on the shape of the beam. The adjustment of the colour of the light emission is beneficial in the embodiment wherein the embedded code is comprised in the visible light emitted by the light emitting device, because colour adjustment may result in an improved signal/noise ratio. It may further allow a user to see the effect area more clearly.

According to a second aspect of the present invention, the object is achieved by a system for generating and detecting an embedded code comprised in the light emission of a light emitting device, the system comprising:
the light emitting device of any one of the above-mentioned embodiments, and a light receiving device comprising:
   a detector arranged for detecting the embedded code in the beam of light emitted by the light emitting device, and
   a second processor arranged for decoding the embedded code, and for generating a control command for the light receiving device based on the embedded code.

In an embodiment of the system, the light receiving device comprises at least one light source arranged for providing general illumination, and the second processor is arranged for controlling the light output of the at least one light source based on the generated control command. This system allows a user to use the light emitting device (such as a remote control device emitting the light) to control one or more lighting devices. The control command generated by the light receiving device may be dependent on the message comprised in the embedded code, which may result in that the beam shape influences the control command for the one or more lighting devices.

According to a third aspect of the present invention, the object is achieved by a method of generating an embedded code comprised in the light emission of a light emitting device, the method comprising the steps of:
   controlling a shape of the beam of light,
   receiving information about the shape of the beam of the light emitted by the light emitting device, and
   generating a message in the embedded code based on the shape of the beam of the light emitted by the light emitting device.

BRIEF DESCRIPTION OF THE DRAWINGS

The above, as well as additional objects, features and advantages of the disclosed devices, systems and methods, will be better understood through the following illustrative and non-limiting detailed description of embodiments of devices and methods, with reference to the appended drawings, in which.

All the figures are schematic, not necessarily to scale, and generally only show parts which are necessary in order to elucidate the invention, wherein other parts may be omitted or merely suggested.

DETAILED DESCRIPTION OF EMBODIMENTS

Figure 1:
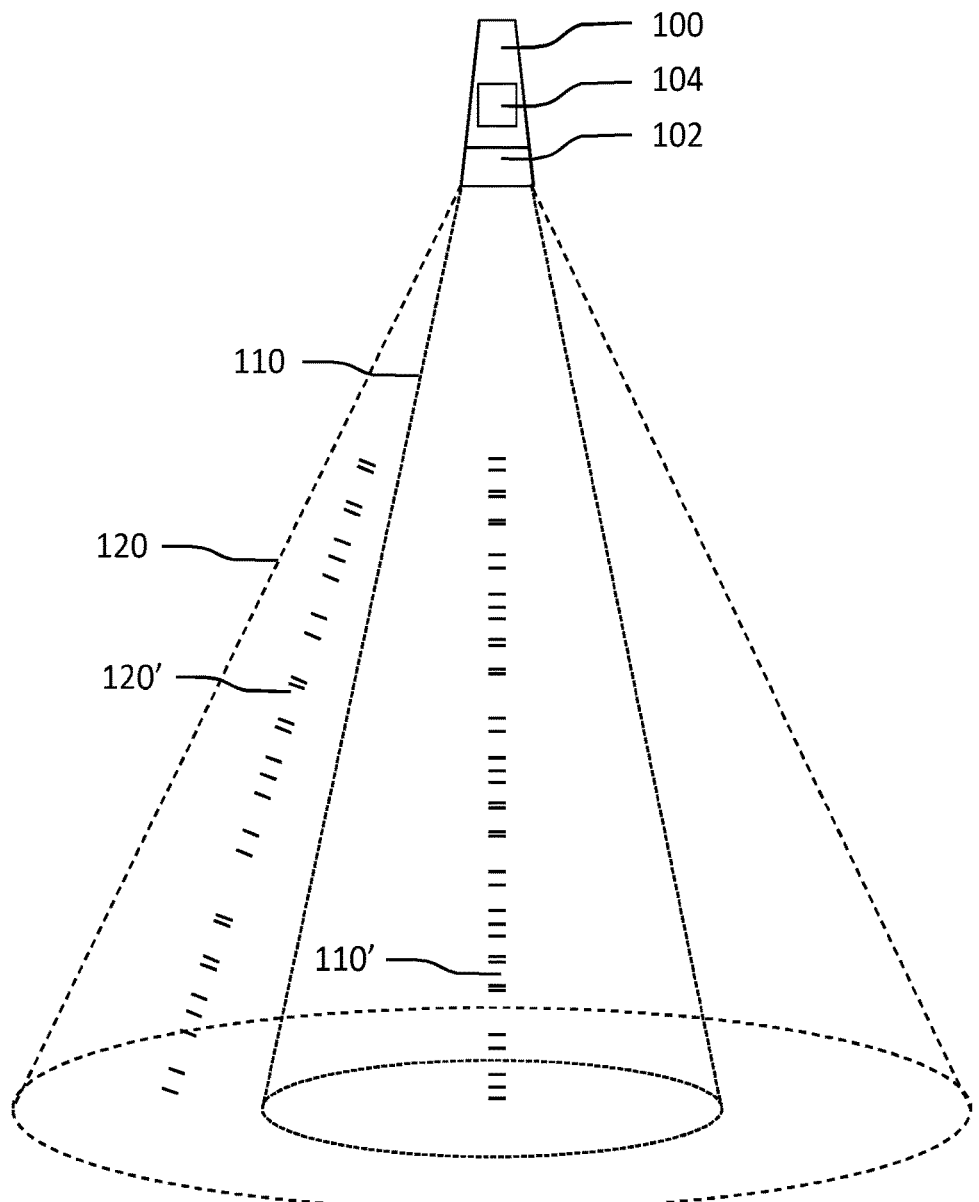
FIG. 1 shows schematically an embodiment of a light emitting device according to the invention and two light beams comprising embedded codes, which are emitted by the light emitting device.

FIG. 1 shows schematically an embodiment of a light emitting device 100 according to the invention. The light emitting device 100 is arranged for emitting a beam of light, which light emission comprising an embedded code. The embedded code comprises a message for a receiving device, which message may comprise, for example, location related information, indoor position information, control commands, etc. The light emitting device 100 comprises a beam shape controller 102 arranged for controlling a shape of the beam of light emitted by the light emitting device 100. The light emitting device 100 further comprises first processor 104 (such as a micro controller) connected to the beam shape controller, arranged for generating the embedded code. The first processor 104 is further arranged for embedding the message in the embedded code based on the shape of the beam of light emitted by the light emitting device 100. The embedded code may be created by controlling a time-varying, modulated current to the light source of the light emitting device 100 to produce variations in the light output that are detectable by a light detector, such as a camera, a photoelectric sensor, an image sensor etc.

The light emitting device 100 comprises a light source arranged for emitting the beam of light comprising the embedded code. The embedded code may be comprised in the invisible light (e.g. infrared or ultraviolet) emitted by the light source. This may be advantageous if the light emitting device 100 is not arranged for emitting visible light, and if the invisible light emission has a control function. For example, the light emitting device 100 may be an IR (infrared) emitting remote control device arranged for controlling light receiving devices.

In an embodiment, the light may be comprised in the visible light emitted by the light source. This embodiment is beneficial if the light emitting device 100 has illumination functionality, because it may remove the requirement for a dedicated code emitting source in the light emitting device 100. Comprising the embedded code in visible light results in that the embedded code may only be detected by a receiving device that is located in the illuminated area, which is advantageous because it makes the effect area (i.e. the illuminated area) of the light emitting device 100 perceptible to a user. This allows the user, in an embodiment wherein the light emitting device 100 is a lighting device providing information to a user operable device such as a smart phone, a smart wearable device, a tablet pc, etc., to position the user operable device in the effect area (i.e. the illuminated area), thereby enabling the user operable device to receive information from the lighting device. In an alternative embodiment, wherein the user operates the light emitting device 100 (e.g. a remote control device) to control receiving devices (e.g. lamps comprising a detector arranged for detecting and decoding the embedded code), it allows the user to see the illuminated area and therewith the effect area, providing the user with a visual aid to establish information communication between the light emitting device 100 and the receiving device.

The first processor 104 may be arranged for receiving a signal from the beam shape controller 102, which signal indicates the beam shape of the light emission. This allows the first processor 104 to determine which message to embed in the light emission based on the signal received from the beam shape controller 102. Alternatively, the first processor 104 may control the beam shape controller 102 to adjust/control the beam shape of the light emission. This allows the first processor 104 to determine which message to embed in the light emission based on the beam shape determined by the first processor 104.

FIG. 1 further shows two light beams 110, 120 comprising embedded codes 110', 120' respectively. The first processor 104 of the light emitting device 100 of FIG. 1 determines the message in the embedded code based on the beam shape of the light emission. FIG. 1 illustrates a first beam 110 comprising a first embedded code 110' emitted at a first moment in time and a second beam 120 comprising a second embedded code 120' emitted at a second moment in time. The narrow first beam 110 may comprise a code 110' that comprises a message that provides specific information for a receiving device that is located in the effect area (i.e. the area illuminated by the first beam), while the broader second beam 120 may comprise a code 120' that comprises a message that provides general information for a receiving device that is located in the effect area. The specific information may, for example, be related to the specific location of the receiving device, while the general information may be related to general location information about the space wherein the receiving device is located. For example, the light emitting device 100 may be implemented in the ceiling of a store to provide receiving devices (for example smart devices such as smart phones, smart wearables, etc., comprising a detector for detecting the embedded code) information about items in the store. The broad second beam 120 may illuminate a complete isle in the store, thereby providing general information about the products in the isle to all receiving devices present in the isle. The light emitting device may switch to the narrow first beam 110 to provide information about a specific product located nearby or in the first beam shape 110' to a receiving device.

Figure 2A:
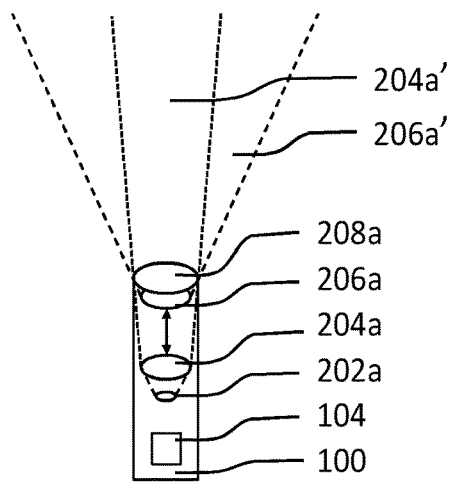
FIGS. 2*a*, 2*b* and 2*c* show schematically examples of how the beam shape controller may control the beam shape of the light emission.
Figure 2B:
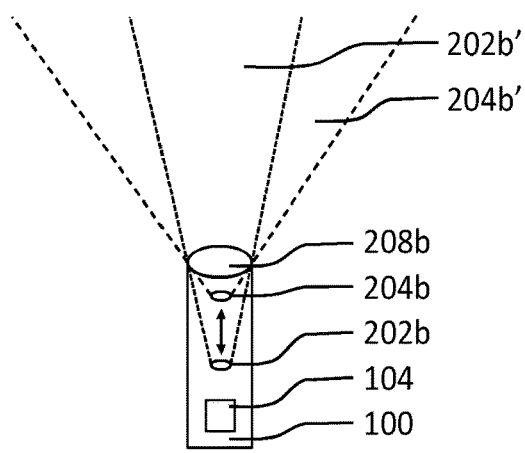

The beam shape controller 102 is arranged for controlling a shape of the beam of light emitted by the light emitting device 100. The beam shape controller 102 may comprise controllable optics for controlling the shape of the beam. The beam shape controller 102 may comprise controllable and/or moveable lenses, mirrors, reflectors, light distribution elements, light sources, etc. in order to control the beam shape. FIGS. 2a and 2b show examples of how the controllable optics may control the beam shape of the light emission.

In the example of FIG. 2a, the light emitting device 100 comprises a light source 202a, a light emission window 208a (such as a lens) and a moveable lens 204a, 206a. The moveable lens 204a, 206a may be set to a plurality of positions, for example along an axis perpendicular to the lens, in resulting in a different beam shape for each setting. In the example of FIG. 2a, the moveable lens may be set to a first position 204a providing a first beam shape 204a', and to a second position 206a providing a second beam shape 206a'. The beam shape controller is connected to the first processor 104, providing information to the first processor 104 about its settings, thereby allowing the first processor 104 to determine, based on the beam shape 204a' or 206a', which message to embed in the embedded code.

In the example of FIG. 2b, the light emitting device 100 comprises a light source 202b, 204b, a light emission window 208b (such as a lens). In this example, the beam shape controller is arranged for moving the light source 202b, 204b between a plurality of positions, for example along an axis perpendicular to the light emission window 208b, in resulting in a different beam shape for each setting. In the example of FIG. 2b, the moveable light source may be set to a first position 202b providing a first beam shape 202kb', and to a second position 204b providing a second beam shape 204b'. The beam shape controller is connected to the first processor 104, providing information to the first processor 104 about its settings, thereby allowing the first processor 104 to determine, based on the beam shape 202b' or 204b', which message to embed in the embedded code.

Figure 2C:
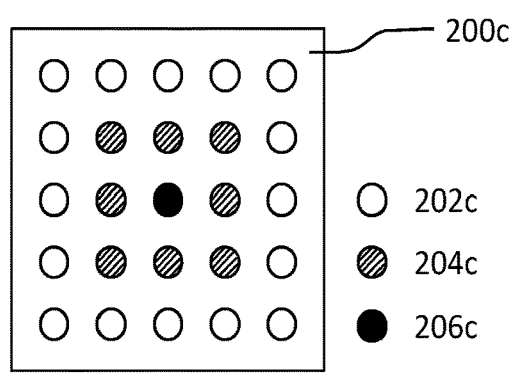

FIG. 2c illustrates an example of an embodiment wherein the light emitting device 200c comprises a plurality of light sources arranged for emitting the light, and wherein the beam shape controller is arranged for controlling the shape of the beam by selectively controlling the light emission of the plurality of light sources. The beam shape controller may, for example, power light source 206c to provide a narrow beam shape, power the 8 light sources 204c and light source 206c to provide a broader beam shape or to power the 16 light sources 202c, the 8 light sources 204c and light source 206c to provide the broadest beam shape. Alternatively, the beam shape controller may, for example, power the top 5 light sources 202c and the bottom 5 light sources 202c to provide two beam shapes. The beam shape controller is connected to the first processor 104, providing information to the first processor 104 about its settings, thereby allowing the first processor 104 to determine which message to embed in the embedded code. Alternatively, the first processor 104 is arranged for controlling the beam shape controller, which results in that the first processor comprises information of the beam shape already.

It should be noted that the examples of FIGS. 2a, 2b and 2c are examples of how the beam shape controller may control the shape of the beam, and that a person skilled in the art is able to design many alternative beam shape controllers to control the shape of the beam.

Figure 3:
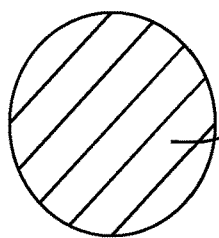
FIG. 3 shows schematically a plurality of examples of beam shapes that may be emitted by the light emitting device.
Figure 3:
Figure 3:
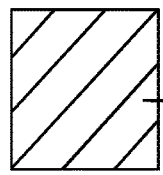
Figure 3:
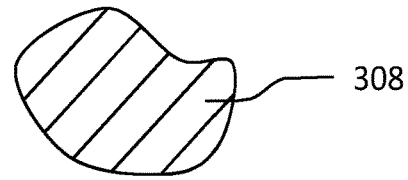
Figure 3:
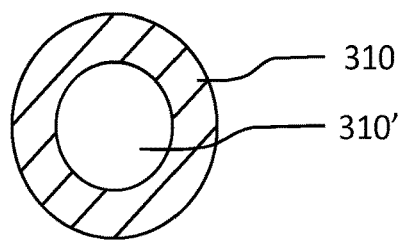
Figure 3:
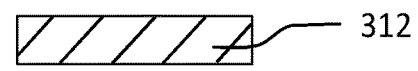
Figure 3:
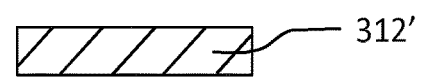

As illustrated in FIGS. 2a, 2b and 2c, the beam shape controller may be arranged for providing many different shapes of beams. FIG. 3 illustrates 6 examples of beam shapes that may be created by the beam shape controller of the light emitting device.

In a first example, the beam shape may be such that it illuminates one area. The area may have any shape, such as a circle 302, an oval 304, a square 306, a triangle, a star, a non-symmetrical shape 308, etc. The beam shape controller may, for example, increase or decrease the size of the effect area (i.e. the illumination area), or to control the shape of the effect area (e.g. from a circle 302 to an oval 304, from a square 306 to a triangle, from an oval 304 to a non-symmetrical shape 308, etc.). The control of the shape may depend on the function of the light emitting device in its context.

In another example, the beam shape may be such that it illuminates an area excluding an inner area of the illuminated area. An example of such a beam shape is annular shape 310, which excludes the inner circle 310'. The beam shape controller may, for example, increase or decrease the size of the annular area 310, or control the beam shape such that the light only illuminates the inner circle 310'. This provides the advantage that the light emitting device can communicate different messages for inner and outer areas.

In another example, the beam shape may be such that it illuminates a plurality of areas. The beam shape may, for example, be such that it illuminates two areas 312 and 312'. This results in that only receiving devices present in the areas may receive the message, and that devices located in the space in between the plurality of illuminated areas are excluded from receiving the messages. The beam shape controller may, for example, increase the number of areas, move the plurality of areas, control the shapes of the individual areas, combine the plurality of areas into one area, etc. The beam shape controller may control the shape depending on the function of the light emitting device in its context. Additionally, the first processor 104 may be arranged for embedding a first message in the beam illuminating a first area and a second message in the beam illuminating a second area.

The light emitting device may further comprise a user interaction element (not shown) connected to the beam shape controller, wherein the user interaction element is arranged for receiving a user input, and wherein the control of the shape of the beam is based on the user input. The user interaction element may, for example, be a handle that when operated mechanically controls the beam shape (for example by mechanically controlling the optics of the light emitting device as illustrated in FIGS. 2a and 2b), a touch screen, touch pad or button that is arranged for receiving a user input, which digitally controls the beam shape (for example by controlling a plurality of light sources of the light emitting device as illustrated in FIG. 2c). This allows the user operating the user interaction element to control the beam shape and therewith the message embedded in the embedded code. Alternatively, the user input element may receive a user input based on the presence of a user. The beam shape controller may be triggered to control the beam shape based on the presence of a person (e.g. based on an activation of a presence sensor such as a PIR sensor which is connected to the beam shape controller) or based on the proximity of a further device (such as a mobile phone or a smart watch). The proximity between the light emitting device and the further device may be detected based on, for example, the received signal strength (RSS) of a signal received from the further device, via near field communication (NFC) between the further device and the light emitting device, via location data from an (indoor) positioning system or any other type of proximity detection system. This allows the light emitting device to provide a specific beam shape with a specific message when a user is detected in proximity of the light emitting device.

Figure 4:
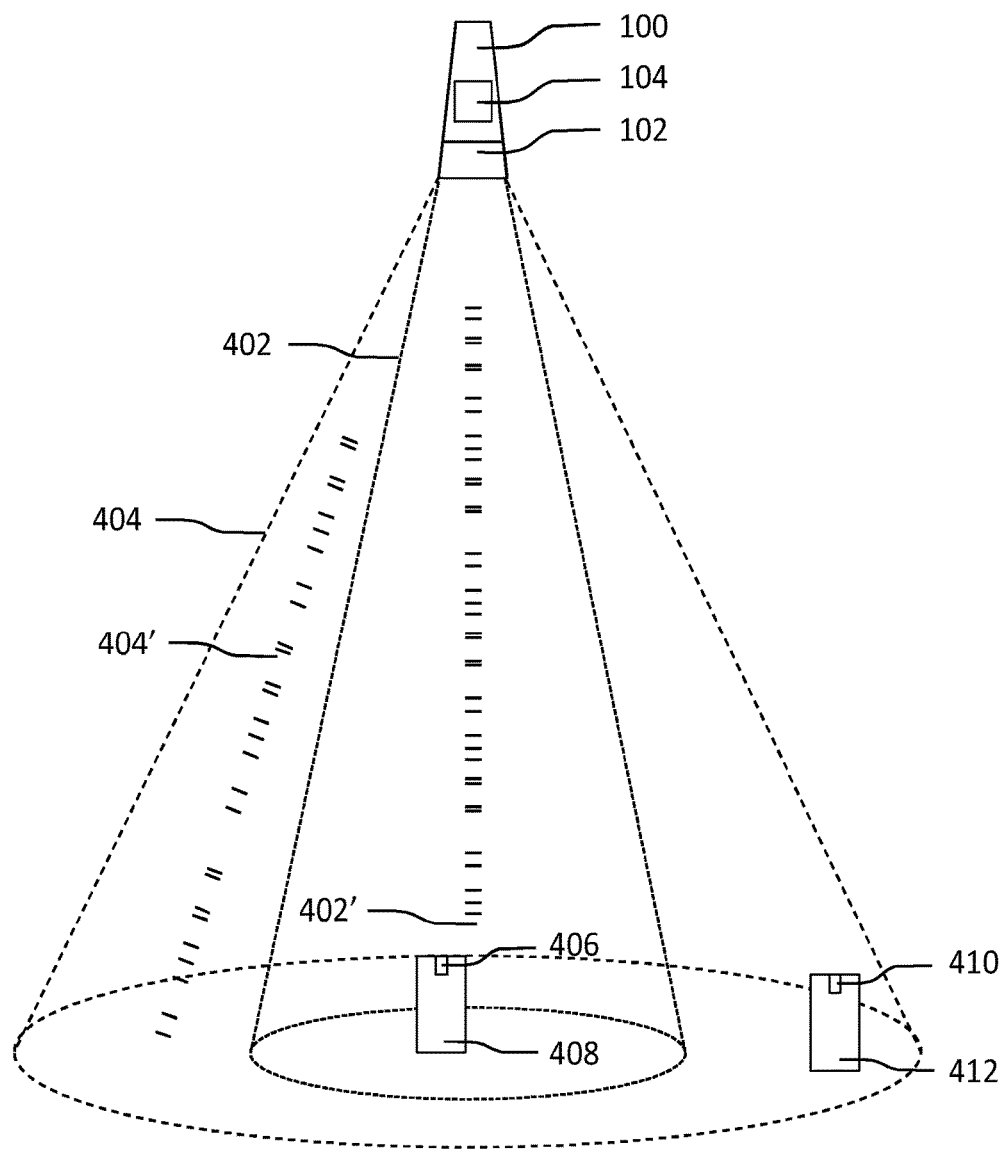
FIG. 4 shows schematically an embodiment of a light emitting device and two light receiving devices receiving different codes for different beam shapes.

FIG. 4 shows schematically an embodiment of a system comprising a light emitting device 100 and two light receiving devices 408 and 412 receiving different codes 402' and 404' respectively from different beam shapes 402 and 404. In this embodiment, the purpose of the light emitting device 100 is to provide position information to the light receiving devices 408 and 412. The light receiving devices 408 and 412 comprise a receiver 406 and 410 respectively (such as a camera, a photoelectric sensor, etc.) for receiving the embedded code from the light emitting device 100. The light receiving devices 408 and 412 further comprise a second processor (not shown) for decoding the embedded code based on one or more images taken by the camera, based on a signal generated by the photoelectric sensor, etc. The second processor is further arranged for generating a control command for the light receiving device based on the embedded code. The light emitting device 100 may, for example, provide position information and shape information in the message, thereby providing the light receiving devices 408 and 412 with sufficient information to determine a position relative to the light emitting device 100. The first light receiving device 408 may receive the position information and the shape information, whereupon its second processor determines that the first lighting device 408 is located in the area illuminated by beam shape 402. The first processor 104 of the light emitting device 100 may control the beam shape controller 102 in order to increase beam shape 402 to beam shape 404, and therewith adjusting the embedded code from 402' to 404'. Upon this adjustment, both light receiving device 408 and light receiving device 412 receive the message embedded in the code 404', whereupon the second processors of light receiving devices 408 and 412 determine that they are located somewhere in the area illuminated by beam shape 404.

In an embodiment, the light receiving device is arranged for commissioning the light emitting device. The light receiving device may be arranged for receiving position information from a positioning system (e.g. an indoor positioning system, a beacon-based positioning system, etc.). In this embodiment, the light emitting device 100 is arranged for providing the shape information in the message. This allows the light receiving device to communicate its own position combined with the shape information to a central lighting control system. By providing location information about the light emitting device 100 to the central lighting control system, the central lighting control system is able to determine the position of the light emitting device 100, with an accuracy based on the beam shape/beam size. A broader beam shape will provide a less accurate position, which may be advantageous if for example room information is required by the central lighting system, while a narrower beam shape will provide a more accurate position, which may be advantageous if the exact location in the room is required by the central lighting control system. The beam shape information may further provide information about the functionality of the light emitting device 100 to the light receiving device. The light emitting device 100 may, for example, have a first light setting wherein it has task illumination functionality and a second light setting wherein it has ambient illumination functionality. The light receiving device may, based on the received shape information, determine the current functionality of the identified light emitting device 100. This functionality may be further communicated to the central lighting control system for commissioning purposes.

Figure 5:
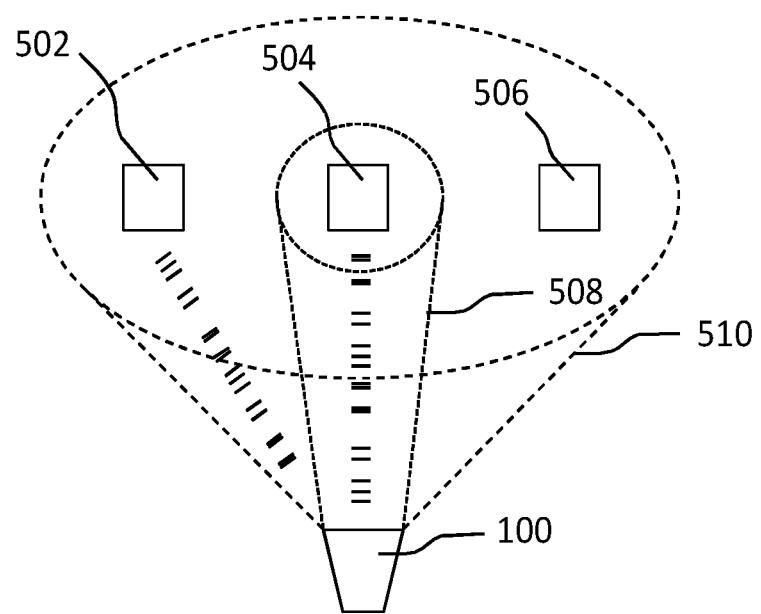
FIG. 5 shows schematically an embodiment of a plurality of light receiving devices and a light emitting device emitting a multicast message for a first beam shape and emitting a unicast message for a second beam shape.

FIG. 5 shows schematically an embodiment of a plurality of light receiving devices 502, 504 and 506 and a light emitting device 100. In this embodiment, the first processor (not shown) is arranged for embedding a multicast message in the embedded code for a first shape of the beam 508 and for embedding a unicast message in the embedded code for a second shape of the beam 510. The multicast message is a message addressed to a plurality of light receiving devices 502, 504 and 506, while the unicast message is a message addressed to a single light receiving device (e.g. receiving device 504). This embodiment may, for example, be beneficial if the light emitting device 100 is a control device for controlling a plurality of light receiving devices. The light emitting device may be a remote control device comprising a light source, a first processor and a beam shape controller, and the light receiving devices may, for example, be lamps comprising a receiver for receiving the embedded code and a second processor arranged for decoding the received code and for identifying the message. As illustrated in FIG. 5, the first processor of the light emitting device may determine to generate a unicast message for the second beam shape 508, which unicast message is addressed to one of a plurality of receiving devices, for example receiving device 504. Upon controlling the beam shape from beam shape 508 to beam shape 510, the first processor controls the message embedded in the code from a unicast to a multicast message intended to be received by a plurality of receiving devices, for example receiving devices 502, 504 and 506. This embodiment allows a user to switch between a unicast mode for controlling a single receiving device and a multicast mode for controlling a plurality of receiving devices by controlling the beam shape controller.

In an embodiment of the light emitting device 100, the first processor 104 is further arranged for controlling an intensity of the light emission of the light emitting device 100 based on the shape of the beam. This embodiment allows the light emitting device 100 to increase or decrease the intensity of the light output based on the size/shape of the beam, which increased intensity may result in an improved signal/noise ratio (the signal being the light emission comprising the embedded code emitted by the light emitting device 100, and the noise being light from further light emitting sources), which may be beneficial when multiple noise sources are present in the effect area. The adjustment of the intensity of the light emission may be further beneficial in the embodiment wherein the embedded code is comprised in the visible light emitted by the light emitting device 100, because it may allow a user to see the effect area more clearly. For example, if the beam of the light emitting device 100 is very wide, it may not be required that the user sees the exact effect area, while when the beam is very narrow, it may be desired that the user sees the area wherein the message may be received. Additionally or alternatively, the first processor 104 is further arranged for controlling a colour of the light emission of the light emitting device 100 based on the shape of the beam. The adjustment of the colour of the light emission is beneficial in the embodiment wherein the embedded code is comprised in the visible light emitted by the light emitting device 100, because colour adjustment may result in an improved signal/noise ratio (the signal being the light emission comprising the embedded code emitted by the light emitting device 100, and the noise being light from further light emitting sources). It may further allow a user to see the effect area more clearly.

The processor 104 may be arranged for embedding information in the message, which information is indicative of that the light emitting device 100 has a controllable beam shape. This provides devices which receive the message from the light emitting device 100 information about the light emitting device 100. This may enable receiving devices to send a control command to the light emitting device 100 to request the light emitting device 100 to change its beam shape or size, and therewith the message (e.g. the position information, the beam shape information, to switch between unicast messages and multicast messages, the light intensity of the emitted light, etc.).

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer or processing unit. In the device claim enumerating several means, several of these means may be embodied by one and the same item of hardware. The mere fact that certain measures are recited in mutually different dependent claims does not indicate that a combination of these measures cannot be used to advantage.

The invention claimed is:
1. A light emitting device for emitting a beam of light, the light emission comprising an embedded code, the light emitting device comprising:
   a beam shape controller for controlling a shape of the beam of light, and
   a first processor connected to the beam shape controller, arranged for generating the embedded code, wherein the first processor is further arranged for embedding a message in the embedded code based on the shape of the beam of light, wherein the message comprises beam shape information of the shape of the beam of light.

2. The light emitting device of claim 1, wherein the embedded code is comprised in visible light in the light beam emitted by the light emitting device.

3. The light emitting device of claim 2, wherein the first processor is further arranged for controlling a colour of the light emitted by the light emitting device based on the shape of the beam.

4. The light emitting device of claim 1, wherein the beam shape controller comprises controllable optics for controlling the shape of the beam.

5. The light emitting device of claim 1, wherein the light emitting device comprises a plurality of light sources arranged for emitting the light, and wherein the beam shape controller is arranged for controlling the shape of the beam by selectively controlling the light emission of the plurality of light sources.

6. The light emitting device of claim 1, wherein the first processor is further arranged for controlling the beam shape controller.

7. The light emitting device of claim 1, wherein the light emitting device further comprises a user interaction element connected to the beam shape controller, wherein the user interaction element is arranged for receiving a user input, and wherein the control of the shape of the beam is based on the user input.

8. The light emitting device of claim 1, wherein the first processor is arranged for embedding a multicast message in the embedded code for a first shape of the beam and for embedding a unicast message in the embedded code for a second shape of the beam, wherein the first shape is different from the second shape, and wherein the multicast message is intended to be received by a plurality of receiving devices and the unicast message is intended to be received by a predetermined receiving device.

9. The light emitting device of claim 1, wherein the first processor is further arranged for embedding position information in the message, the position information being related to the position of the light emitting device.

10. The light emitting device of claim 1, wherein the first processor is further arranged for controlling an intensity of the light emission of the light emitting device based on the shape of the beam.

11. A system for generating and detecting an embedded code comprised in a beam of light emitted by a light emitting device, the system comprising:
a light emitting device for generating the beam of light with embedded code comprising:
a beam shape controller for controlling a shape of the beam of light, and
a first processor connected to the beam shape controller, the first processor arranged for generating the embedded code, wherein the first processor is further arranged for embedding a message in the embedded code based at least in part on a shape of the beam of light, wherein the message comprises beam shape information of the shape of the beam of light; and
a light receiving device comprising:
a detector arranged for detecting the embedded code in the beam of light emitted by the light emitting device, and
a second processor arranged for decoding the embedded code, and for generating a control command for the light receiving device based on the embedded code.

12. The system of claim 11, wherein the second processor is arranged for determining a position of the light receiving device relative to the light emitting device based on the detected embedded code.

13. The system of claim 11, wherein the light receiving device comprises at least one light source arranged for providing illumination, and wherein the second processor is arranged for controlling the light output of the at least one light source based on the generated control command.

14. A method of generating an embedded code comprised in the light emission of a light emitting device, the method comprising the steps of:
controlling a shape of the beam of light,
receiving information about the shape of the beam of the light emitted by the light emitting device, and
embedding a message in the embedded code based on the shape of the beam of the light emitted by the light emitting device, wherein the message comprises beam shape information of the shape of the beam of light.

* * * * *